US008664836B1

(12) United States Patent
Kuypers et al.

(10) Patent No.: US 8,664,836 B1
(45) Date of Patent: Mar. 4, 2014

(54) PASSIVATED MICROMECHANICAL RESONATORS AND RELATED METHODS

(75) Inventors: Jan H. Kuypers, Cambridge, MA (US); David M. Chen, Brookline, MA (US); Alexei Gaidarzhy, Brighton, MA (US); Guiti Zolfagharkhani, Brighton, MA (US)

(73) Assignee: Sand 9, Inc., Cambridge, MA (US)

( * ) Notice: Subject to any disclaimer, the term of this patent is extended or adjusted under 35 U.S.C. 154(b) by 465 days.

(21) Appl. No.: 12/885,080

(22) Filed: Sep. 17, 2010

Related U.S. Application Data

(60) Provisional application No. 61/243,779, filed on Sep. 18, 2009.

(51) Int. Cl.
*H01L 41/16* (2006.01)

(52) U.S. Cl.
USPC ......... 310/345; 310/313 R; 310/340; 310/365

(58) Field of Classification Search
USPC .............. 310/313 A, 313 B, 313 R, 340, 346, 310/363–365, 345
See application file for complete search history.

(56) References Cited

U.S. PATENT DOCUMENTS

| | | | |
|---|---|---|---|
| 3,916,348 A * | 10/1975 | Toda et al. ................. 333/155 |
| 3,943,389 A * | 3/1976 | Hickernell et al. ....... 310/313 A |
| 5,039,957 A | 8/1991 | Greer et al. |
| 5,572,052 A * | 11/1996 | Kashihara et al. ............ 257/295 |
| 5,914,553 A | 6/1999 | Adams et al. |
| 5,929,723 A | 7/1999 | Kimura et al. |
| 6,124,765 A | 9/2000 | Chan et al. |
| 6,316,860 B1 * | 11/2001 | Kimura et al. ............ 310/313 A |
| 6,828,713 B2 | 12/2004 | Bradley et al. |
| 6,909,221 B2 | 6/2005 | Ayazi et al. |
| 6,943,484 B2 | 9/2005 | Clark et al. |
| 6,954,020 B2 | 10/2005 | Ma et al. |
| 7,005,946 B2 | 2/2006 | Duwel et al. |
| 7,211,926 B2 | 5/2007 | Quevy et a |
| 7,215,061 B2 | 5/2007 | Kihara et al. |
| 7,408,286 B1 * | 8/2008 | Bhattacharjee et al. ...... 310/346 |
| 7,459,991 B2 * | 12/2008 | Ruile et al. ..................... 333/133 |
| 7,492,241 B2 | 2/2009 | Piazza et al. |

(Continued)

FOREIGN PATENT DOCUMENTS

| | | | |
|---|---|---|---|
| JP | 2002-76820 | * | 3/2002 |
| JP | 2005-80202 | * | 3/2005 |

(Continued)

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

(Continued)

*Primary Examiner* — Thomas Dougherty
(74) *Attorney, Agent, or Firm* — Wolf, Greenfield & Sacks, P.C.

(57) ABSTRACT

Passivated micromechanical resonators and related methods are described. Applicants have appreciated that polycrystalline conductive layers used as electrodes for some MEMS resonators are a source of mechanical and electrical instability. To inhibit or prevent contamination of such conductive layers, which may exacerbate the instabilities, passivation structures are used. The passivation structures can be grown, deposited, or otherwise formed.

20 Claims, 7 Drawing Sheets

(56) References Cited

U.S. PATENT DOCUMENTS

| | | | |
|---|---|---|---|
| 7,504,909 | B2 | 3/2009 | Tada |
| 7,589,452 | B2* | 9/2009 | Hauser et al. ............ 310/313 R |
| 7,589,453 | B2* | 9/2009 | Meister et al. ............ 310/313 R |
| 7,724,103 | B2 | 5/2010 | Feng et al. |
| 7,791,432 | B2 | 9/2010 | Piazza et al. |
| 8,044,553 | B2* | 10/2011 | Chen et al. ............... 310/313 R |
| 2005/0073078 | A1 | 4/2005 | Lutz et al. |
| 2006/0255884 | A1* | 11/2006 | Tanaka ......................... 333/195 |
| 2006/0290449 | A1 | 12/2006 | Piazza et al. |
| 2007/0096847 | A1 | 5/2007 | Trutna et al. |
| 2007/0115078 | A1 | 5/2007 | Sano et al. |
| 2007/0139140 | A1 | 6/2007 | Rao et al. |
| 2007/0284971 | A1 | 12/2007 | Sano et al. |
| 2008/0129150 | A1* | 6/2008 | Zhang .......................... 310/329 |
| 2008/0143217 | A1 | 6/2008 | Ho et al. |
| 2008/0204153 | A1 | 8/2008 | Yoshida et al. |
| 2008/0246559 | A1 | 10/2008 | Ayazi et al. |
| 2008/0272852 | A1 | 11/2008 | Six |
| 2008/0297281 | A1 | 12/2008 | Ayazi et al. |
| 2009/0009269 | A1* | 1/2009 | Nguyen et al. ................ 333/199 |
| 2009/0108381 | A1 | 4/2009 | Buchwalter et al. |
| 2009/0108959 | A1 | 4/2009 | Piazza et al. |
| 2009/0144963 | A1* | 6/2009 | Piazza et al. ..................... 29/594 |
| 2009/0152993 | A1* | 6/2009 | Kando ........................... 310/346 |
| 2010/0038997 | A1* | 2/2010 | Andle et al. ............. 310/323.21 |
| 2010/0182102 | A1* | 7/2010 | Kuypers et al. ................ 333/197 |
| 2011/0273061 | A1* | 11/2011 | Thalmayr et al. ............. 310/346 |

FOREIGN PATENT DOCUMENTS

| | | | |
|---|---|---|---|
| JP | 2009-118369 | * | 5/2009 |
| WO | WO 02/17481 A2 | | 2/2002 |
| WO | WO 2005/029700 A1 | | 3/2005 |
| WO | WO 2010/077311 A1 | | 7/2010 |
| WO | WO 2010/077313 A1 | | 7/2010 |

OTHER PUBLICATIONS

International Search Report and International Preliminary Report on Patentability for PCT/US2006/021298 mailed Nov. 6, 2006 and Dec. 6, 2007 respectively.

Piazza et al., "Low motional resistance ring-shaped contour-mode aluminum nitride piezoelectric micromechanical resonators for UHF applications," Micro Electro Mechanical Systems, 2005. MEMS 2005. 18th IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an AIN/Si Structure," Proceedings Ultrasonics Symposium, Oct. 31-Nov. 3, 1993, Baltimore, MD, IEEE 1993 vol. 1, pp. 371-374.

Kuypers et al. "Intrinisic Temperature Compensation of Aluminum Nitride Lamb Wave Resonators for Multiple-Frequency References"; 2008 IEEE International Frequency Control Symposium, pp. 240-249, May 19-21, 2008.

Office Action from U.S. Appl. No. 12/885,040, issued Jan. 7, 2013.

* cited by examiner

PASSIVATED MICROMECHANICAL RESONATORS AND RELATED METHODS

RELATED APPLICATIONS

The present application claims priority under 35 U.S.C. §119(e) to U.S. Provisional Patent Application Ser. No. 61/243,779 filed Sep. 18, 2009 and entitled "Passivation Coatings for Resonating Structures Used in Oscillators" which is hereby incorporated herein by reference in its entirety.

BACKGROUND

1. Field

The technology described herein relates to passivated micromechanical resonators and related methods.

2. Related Art

Some microelectromechanical systems (MEMS) resonators include a micromechanical resonating component which is actuated to induce movement or vibration of the component. The movement or vibration is then translated into an electrical signal used as the resonating component output signal. Such signals are sometimes used as reference signals in timing oscillators or other electronics.

A MEMS resonator is conventionally characterized by several aspects of its operation. One such aspect is the electrical noise of the resonator (i.e., the noise occurring on the resonator output signal), including the phase noise. Another aspect is the long term frequency drift, also referred to as "aging." Still another aspect is the power handling capability. The quality factor ("Q factor") is also a metric of interest, which is a measure of how much of the input power ("driving" power) is dissipated in the resonator and how much is stored in the resonator itself.

SUMMARY

According to an aspect of the invention, a micromechanical resonator is provided, comprising a micromechanical resonating structure comprising a piezoelectric active layer. The micromechanical resonator further comprises a first electrode disposed on a first side of the piezoelectric active layer and a patterned second electrode disposed on a second side of the piezoelectric active layer so that the piezoelectric active layer is between the first electrode and the second electrode, the patterned second electrode being polycrystalline. The micromechanical resonator further comprises a passivation structure formed on the patterned second electrode and configured to inhibit external contaminants from entering grain boundaries of the patterned second electrode.

According to another aspect of the invention, a passivated micromechanical resonator is provided, comprising a substrate, a first electrical pad on the substrate, and a second electrical pad on the substrate. The passivated micromechanical resonator further comprises a micromechanical resonating structure electrically coupled to the first electrical pad and the second electrical pad. The micromechanical resonating structure comprises a layered temperature compensation structure comprising a first layer and a second layer, the layered temperature compensation structure configured to stabilize operation of the micromechanical resonating structure as temperature varies. The micromechanical resonating structure further comprises a bottom electrode disposed on the layered temperature compensation structure, an active layer comprising a piezoelectric material disposed on the bottom electrode, and a polycrystalline top electrode disposed on the active layer. The polycrystalline top electrode is configured in combination with the bottom electrode to apply an electric field across a thickness of the active layer. The micromechanical resonating structure further comprises a passivation layer disposed on the polycrystalline top electrode and configured to inhibit contact of external materials with the polycrystalline top electrode. The micromechanical resonator further comprises a first anchor and a second anchor mechanically coupling the micromechanical resonating structure to the substrate.

According to another aspect of the invention, a method of fabricating a passivated micromechanical resonator is provided. The method comprises forming an active layer of a micromechanical resonating structure, forming a polycrystalline electrode on the active layer, and forming a passivation structure on the polycrystalline electrode having a different crystal configuration than a crystal configuration of the polycrystalline electrode.

BRIEF DESCRIPTION OF THE DRAWINGS

Various aspects and embodiments of the technology will be described with reference to the following figures. It should be appreciated that the figures are not necessarily drawn to scale. Items appearing in multiple figures are indicated by the same or similar reference number in all the figures in which they appear.

DETAILED DESCRIPTION

Figure 1:
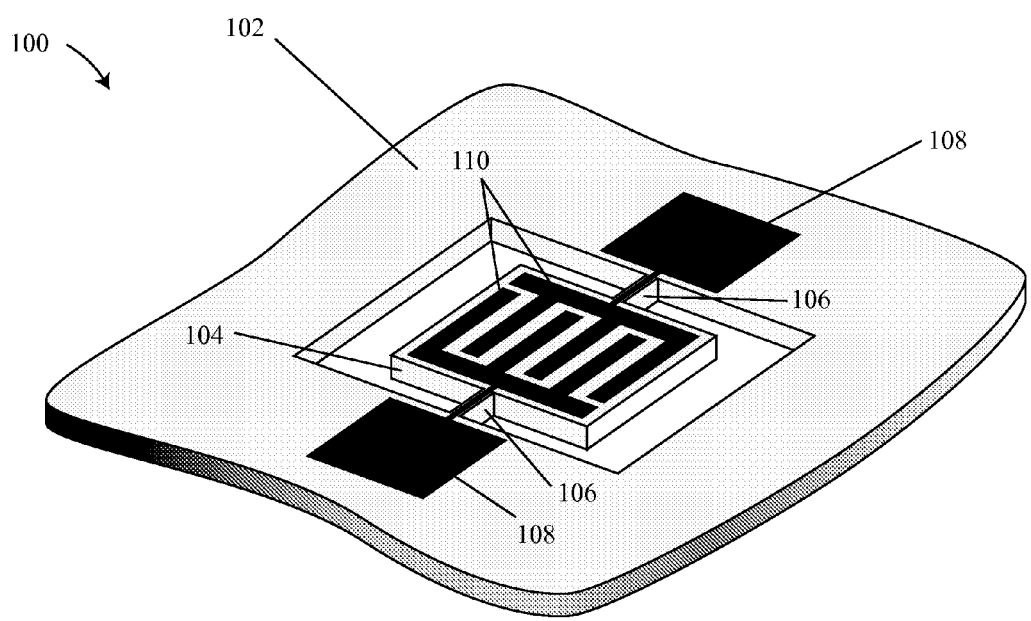
FIG. 1 illustrates a micromechanical systems (MEMS) resonator including a micromechanical resonating structure having multiple electrodes.

In designing micromechanical resonators (including MEMS resonators), it may be desirable to optimize the operating characteristics of the types previously mentioned. For example, it may be desirable to minimize phase noise and frequency drift while maximizing the Q factor and power handling capabilities. Applicants have recognized and appreciated that the use of polycrystalline electrodes in micromechanical resonators gives rise to undesirable operating characteristics, and more specifically that the grain boundaries of the electrodes are a source of undesirable operating characteristics. Different techniques for actuating the micromechanical resonating structure of a micromechanical resonator and then detecting (or sensing) the subsequent movement/vibration of the resonating structure have been developed. Resonators using the piezoelectric effect (and in some instances electrostatic, electrostrictive, and/or magnetostrictive techniques) use an electrically conductive layer (e.g., an electrode) to apply to and sense from the resonating structure an electrical signal, which conductive layer may be polycrystalline. A non-limiting example is shown in FIG. 1.

As shown, the resonator 100, which may be a piezoelectric resonator operating by principles of piezoelectricity, includes a micromechanical resonating structure 104 coupled to a substrate 102 (e.g., a silicon substrate) by anchors 106 and having electrodes 110. One of the electrodes may be used to apply an input electrical signal to the resonating structure 104, via a corresponding pad 108, inducing movement and/or vibration (e.g., if the resonating structure comprises a piezoelectric material). The other of the electrodes may produce or output on a corresponding pad 108 an electrical signal responsive to and representative of the movement/vibration of the resonating structure. Although not shown in the non-limiting example of FIG. 1, some embodiments may also contain a bottom electrode, which in some instances may be patterned or in others may be a single ground plane. It should be appreciated that the electrodes in FIG. 1 and any bottom electrode may be described equally well as being on the resonating structure or part of the resonating structure, i.e., the resonating structure may be described as comprising the electrodes.

Figure 2:
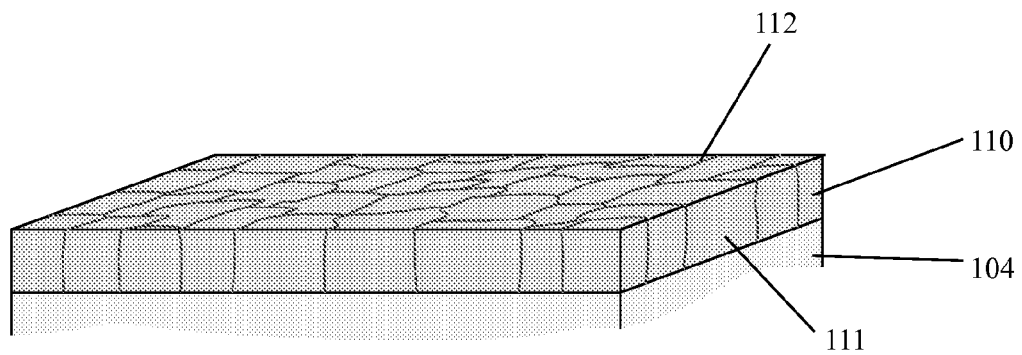
FIG. 2 illustrates a close-up view of a portion of an electrode having a polycrystalline structure.

The electrodes of a micromechanical resonator, such as electrodes 110 of resonator 100, may be metallic and have a polycrystalline structure. FIG. 2 provides a non-limiting example of a close-up view of part of the resonator 100 of FIG. 1. As shown, the illustrated portion of electrode 110 on the resonating structure 104 includes multiple grains 111 with grain boundaries 112. The grain sizes may be on the order of several nanometers to micrometers.

Applicants have appreciated that the grain boundaries of polycrystalline electrodes are a source of significant electrical noise (e.g., phase noise) and long term drift (aging), among other things. Applicants designed and conducted tests that allowed for isolation of the source of electrical noise from among the multiple components of a micromechanical resonator and, in doing so, discovered that the electrodes (or other conductive layers) of such resonators represent a source of sufficiently large noise to result in degraded performance of the resonators. Applicants then appreciated that the polycrystalline nature of the electrodes (or other conductive layers) is the cause of the problematic behavior, and in particular instabilities of the grain boundaries. The grain boundaries are the dominating factor with respect to creep, chemical reaction (i.e. corrosion), and noise (e.g., flicker noise, also referred to as 1/f noise). The impact on resonator behavior is significant as Applicants have appreciated that in high performance oscillators or resonators with noisy metallization the flicker noise of the resonating structure may exceed the flicker noise level of any semiconductor components of the oscillator or resonator and therefore limit the close to carrier phase noise performance of the oscillator. Moreover, polycrystalline conductive layers (e.g., metal films, metallization, electrodes, etc.) may affect the long-term stability of the resonator, limit the power handling capabilities and cause an increase in the phase noise of the oscillator.

While FIG. 2 illustrates part of electrode 110, it should be appreciated that any polycrystalline conductive material of the resonator may have a similar structure and therefore may exhibit a similar impact on the resonator behavior. Thus, any polycrystalline bottom electrode of the resonator, if included, may also exhibit a similar impact with respect to noise, stability, power handling capabilities, and other operating characteristics. Moreover, the problems associated with the polycrystalline conductive material may occur wherever the material is located, and not just on a resonating structure. For example, the pads 108 may similarly impact the resonator operation if polycrystalline, as may any metallization on the anchors (e.g., connecting the pads to the electrodes 110).

Figure 3:
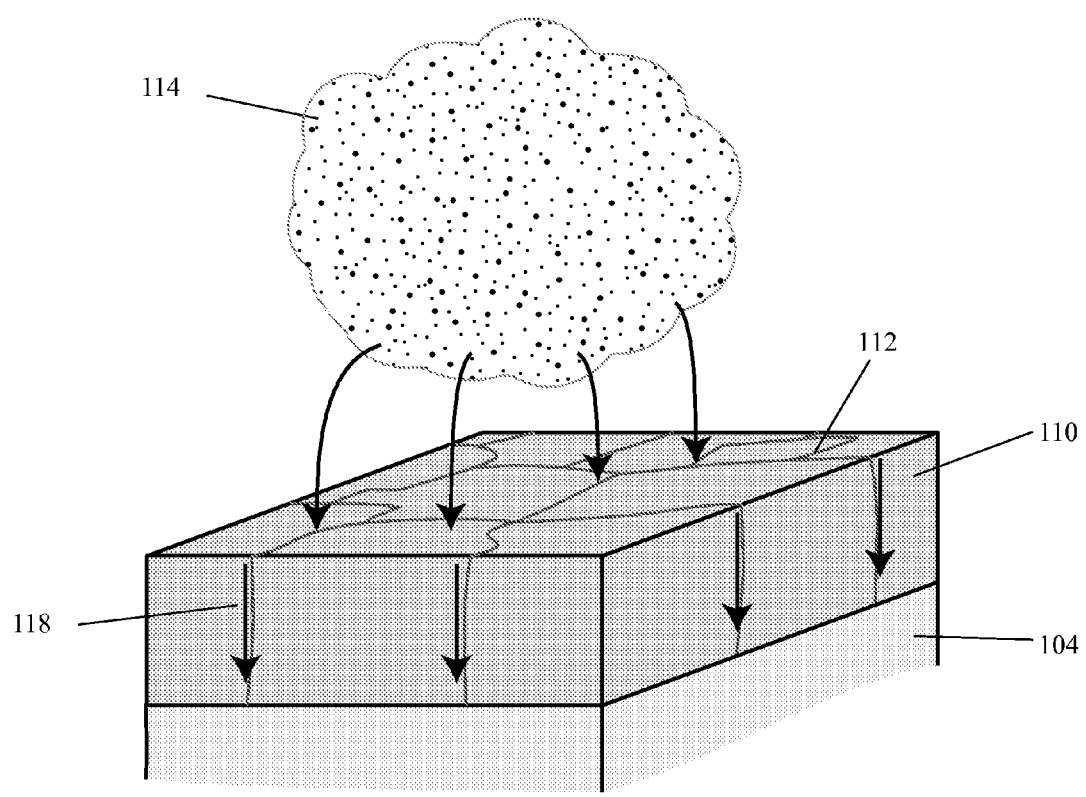
FIG. 3 illustrates a scenario in which a polycrystalline conductive layer is exposed to foreign molecules.

Applicants have further appreciated that the instability of the grain boundaries, and therefore the associated impact on the resonator operation (e.g., phase noise, mechanical instability, etc.) is exacerbated by exposure to foreign atoms or molecules. After formation of a conductive layer (e.g., an electrode or other metallization), a resonator may be exposed to different environments involving exposure to foreign molecules, such as during subsequent processing and/or storage of the resonator. For instance, the conductive layer may be exposed to any of ambient air (and therefore humidity and oxygen), water during cleaning procedures, oxygen plasma (e.g., used during dry cleaning procedures), and other plasmas (e.g., as used for the deposition of plasma enhanced chemical vapor deposition (PECVD) of silicon dioxide, silicon nitride, etc), among others. FIG. 3 illustrates an example, in which a conductive layer such as electrode 110 of FIG. 1 is exposed to foreign molecules 114. The exposure may result in foreign molecules diffusing into the conductive layer and in some instances along the grain boundaries as indicated by arrows 118 since those locations may exhibit the greatest diffusion rates. These molecules may also affect the surface condition of the conductive layer, for example by oxidizing the conductive layer.

Once diffused into the conductive layer (e.g., electrode 110), the foreign molecules can be physically adsorbed or can chemically react with the conductive (e.g., metal) material. The physical adsorption of atoms and molecules can cause material instabilities resulting in frequency drift of the resonator and inherent frequency instability of an oscillator incorporating the resonator as well as increased phase noise originating from miniature fluctuations at the grain boundaries. Possible chemical processes after diffusion of foreign atoms and molecules along the grain boundaries into the material include oxidation and corrosion, which may not only affect the mechanical properties of the material, but moreover the electrical properties.

Figure 4:
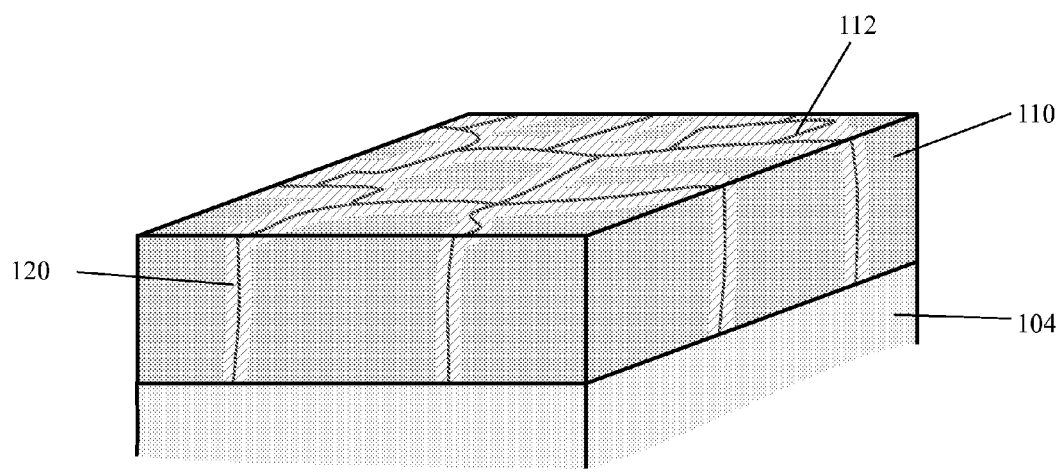
FIG. 4 illustrates oxidation of grain boundaries of a polycrystalline conductive layer.

As an example, FIG. 4 illustrates the oxidation of grain boundaries of a polycrystalline metallization. A portion of electrode 110 is illustrated as an example, though it should be appreciated that the concepts now described apply equally well to any polycrystalline conductive material and that the electrode 110 is used for purposes of illustration only. The oxidation 120, which may result from exposure of the metallization to oxygen after initial deposition (or growth) of the metal material, is represented by the cross-hatching, showing that each grain is at least partially encapsulated by a thin insulating oxide film. Similar to the grain boundaries themselves, this oxide film 120 may include substantial defects and therefore be a source of instability, giving rise to an unstable energy barrier for electrical current. The instability of the energy barrier may give rise to noise, which may appear on an output signal of the resonator as 1/f noise (flicker noise), and which may lead to a strong $1/f^3$ noise component in an output signal of an oscillator incorporating the resonator, which may be undesirable in some scenarios. This strong noise component may be detrimental for the phase noise performance of the oscillator.

In view of the foregoing, aspects of the present invention provide methods and apparatus for passivating polycrystalline conductive layers (e.g., electrodes, metallization, pads, etc.) of micromechanical resonators to minimize or eliminate the occurrence of foreign molecules and atoms contacting such conductive layers. According to one such aspect, a micromechanical resonator comprises a micromechanical resonating structure having a polycrystalline electrode and a passivation structure formed on the polycrystalline electrode. According to one non-limiting embodiment of this aspect, the micromechanical resonating structure may include an active layer of piezoelectric material and the passivation structure may include the same piezoelectric material.

According to another aspect of the present invention, formation of a micromechanical resonator includes forming a micromechanical resonating structure having an active layer, forming a polycrystalline electrode on the active layer, and forming a passivation structure on the polycrystalline electrode. The material and thickness of the passivation structure may be selected to be sufficient to minimize or eliminate the occurrence of foreign molecules and atoms contacting the polycrystalline electrode.

In various embodiments of the aspects described herein, the micromechanical resonators may be MEMS resonators, though not all embodiments are limited in this respect.

The aspects of the invention described above, as well as additional aspects, are described further below. These aspects may be used individually, all together, or in any combination of two or more, as the technology is not limited in this respect.

Figure 5:
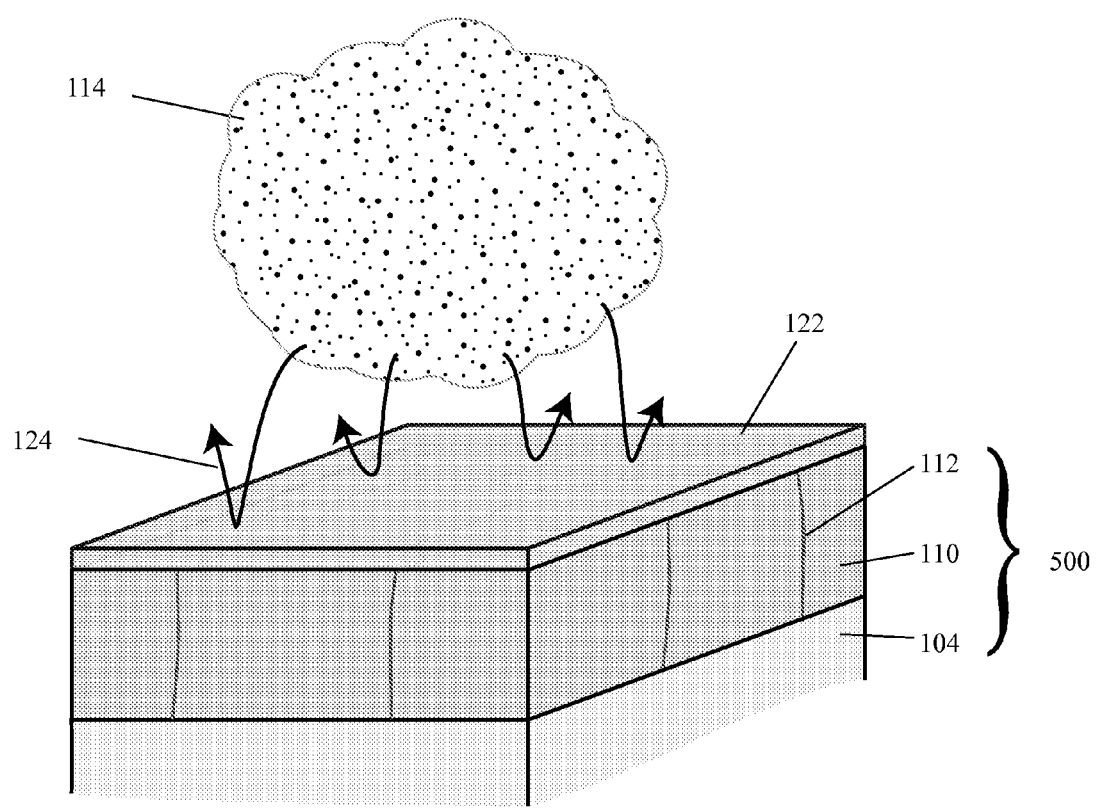
FIG. 5 illustrates a portion of a micromechanical resonator including a portion of a polycrystalline electrode and a passivation structure, according to one non-limiting embodiment of the invention.

FIG. 5 illustrates a non-limiting example of a portion of a micromechanical resonator including a passivated polycrystalline electrode, according to an embodiment in accordance with a first aspect of the invention. As shown, the illustrated portion 500 of a micromechanical resonator includes a passivation structure 122 on the polycrystalline electrode 110, which itself is on the micromechanical resonating structure 104, previously described. The presence of the passivation structure 122 may inhibit or prevent entirely foreign molecules 114 from contacting, and therefore adsorbing into, the polycrystalline electrode 110, as indicated by the arrows 124. In this manner, the passivation structure may minimize or eliminate instability of the grain boundaries 112 that might otherwise arise from exposure to the foreign molecules 114, and therefore the performance of the resonator 500 may be maximized. Thus, the passivation structure may be thought of as a preventive barrier, a blocking barrier, or a protection barrier (or structure).

Figure 6:
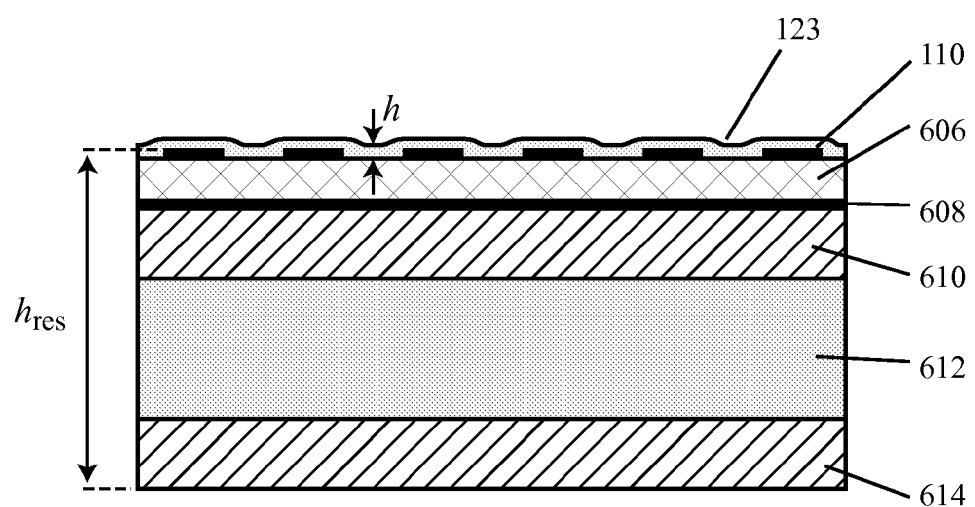
FIG. 6 illustrates in cross-section a micromechanical resonator including a passivated polycrystalline electrode, according to one non-limiting embodiment of the invention.

The passivation structure may take any suitable configuration for inhibiting or preventing the contamination of the conductive layer (e.g., electrode) being protected. For example, according to one embodiment in which the conductive layer is patterned (e.g., a patterned electrode), the passivation structure may be similarly patterned to match the shape/configuration of the conductive layer. For example, referring to FIG. 1, a passivation structure included with the illustrated resonator may have a shape substantially matching the shape of the electrode(s) 110, such that it would be indistinguishable from the electrode(s) 110 in the perspective of FIG. 1. According to an alternative embodiment, the passivation may not be patterned, irrespective of whether the conductive layer being protected is patterned, but rather may be configured as an unpatterned layer (e.g., a "blanket" layer or coating). A cross-section of a non-limiting example is shown in FIG. 6, illustrating a non-patterned passivation layer 123 on the electrode 110. Such a scenario may be facilitated by using a non-conductive or very weakly conductive material for the passivation structure. A weakly conductive material may also prevent charge-up of the active layer (e.g., a piezoelectric layer) without short circuiting the polycrystalline conductive layers. It should be appreciated from FIG. 6 that, according to one embodiment, the passivation structure may be configured to conform to any contours of the conductive layer being protected (e.g., the passivation structure may be configured as a conformal coating covering any otherwise exposed portions of the conductive layer).

The passivation structure may be formed of or comprise any suitable material for inhibiting or preventing contact of foreign molecules with the polycrystalline conductive layer (e.g., a polycrystalline electrode) being protected. Suitable materials may be those with low diffusion rates, low creep, good chemical stability, and that are effective as a diffusion barrier even in thin layers. The passivation structure may be a dielectric in some embodiments and a conductive material in others. Non-limiting examples of suitable materials for the passivation structures 122 and 123 include Aluminum nitride (AlN), Aluminum oxide, Titanium nitride, Zirconium nitride, Silicon oxide, Silicon carbide, Silicon nitride (SiN), and Hafnium oxide. Other materials may also be suitable.

The passivation function of the passivation structure may be facilitated by the passivation structure having a different crystal structure and/or grain structure (if any) than that of the conductive layer being passivated. For example, in some embodiments the passivation structure may be monocrystalline, thus not having grains. In some embodiments, the passivation structure may be amorphous. Alternatively, the passivation structure may be polycrystalline (e.g., a polycrystalline piezoelectric material, as described below) with the grain boundaries of the passivation structure not aligning with the grain boundaries of the passivated conductive material. For example, in some such embodiments a majority of the grain boundaries of the conductive layer do not align with grain boundaries of the passivation structure. In some embodiments, substantially all of the grain boundaries of the conductive layer do not align with grain boundaries of the passivation structure. Other configurations are also possible. Thus, it should be appreciated that the various aspects described herein relating to use of a passivation structure are not limited to the passivation structure having any particular crystal or grain configuration.

According to some embodiments, the micromechanical resonating structure 104 includes an active material which responds to excitation by vibrating/moving. In one embodiment, the micromechanical resonating structure (and more particularly, the active layer) is configured (e.g., by suitable shaping, dimensioning, and arrangement of the components of the micromechanical resonating structure) to support Lamb waves when excited, e.g., when excited by an electric field applied across its thickness or in any other suitable direction. The electric field may be applied by any one or more of the electrodes. Other modes of operation are also possible, however, as described further below. According to one embodiment, the passivation structure comprises the same material as the active material. For example, the micromechanical resonating structure may comprise a piezoelectric layer, such as an AlN layer, and the passivation structure may comprise or be formed of the same piezoelectric material, i.e., AlN in this non-limiting example. Forming the active portion of the micromechanical resonating structure and the passivation structure of the same material may simplify fabrication of the micromechanical resonator, for example by allowing the resonator fabrication to be substantially performed or completed in a single machine, compared to if different materials were used for the active material and the passivation structure which might require processing in separate machines. It should be appreciated that AlN is only one suitable example of a piezoelectric material which may be used for the active layer, and that other materials may alternatively be used, such as but not limited to, $LiNbO_3$, $LiTaO_3$, zinc oxide (ZnO), cadmium sulfide (CdS), lead titanate (Pb-$TiO_3$), lead zirconate titanate (PZT), potassium niobate (KNbO$_3$), Li$_2$B$_4$O$_7$, langasite (La$_3$Ga$_5$SiO$_{14}$), gallium arsenide (GaAs), barium sodium niobate, bismuth germanium oxide, indium arsenide, and indium antimonide.

It should be appreciated from the foregoing that according to some embodiments the passivation structure is easily distinguishable from the conductive material (e.g., electrode) being passivated, for example in those embodiments in which the passivation structure is formed of dielectric material and the electrode is a conductive material. In some embodiments, the passivation structure may differ from the conductive material in terms of electrical resistivity, for example having a greater resistivity than that of the conductive material or by being considerably thinner than the electrode material and therefore effectively having a higher resistance. Alternatively, in some embodiments, the passivation structure may be formed by a distinct, second layer of the conductive material being passivated. For example, referring to FIG. 5, in one embodiment the passivation structure 122 may be formed of the same material as the electrode 110, but may be formed to be distinct. For example, by depositing the passivation structure 122 in a separate deposition stage than that in which the electrode 110 is formed, the passivation structure 122 may have a polycrystalline structure with grain boundaries that do not align (e.g., do not substantially align) with the grain boundaries of the underlying electrode 110. For example, a majority of the grain boundaries of the electrode may not align with grain boundaries of the passivation structure or in some embodiments substantially all grain boundaries of the electrode may not align with grain boundaries of the passivation structure. The passivation structure 122 in such embodiments may therefore operate to inhibit or prevent foreign molecules 114 from reaching the underlying electrode 110 even though the passivation structure and electrode are formed of the same material and both have a polycrystalline structure. In such embodiments, the passivation structure may be made thinner than the underlying electrode material.

According to one embodiment, the material selected for the passivation structure may differ from the material of the conductive layer at least in that the material of the passivation structure may be chemically more stable and less prone to oxidation. Such a characteristic may be quantified in terms of the free energy of formation, $\Delta F$. According to one embodiment, the free energy of formation of the material of the passivation structure is greater than approximately 50 kcal/mol, i.e., $\Delta F.° \geq 50$ kcal/mol, though other values are also possible.

According to another embodiment, the material of the passivation structure is distinguishable from the material of the conductive layer in that the material of the passivation structure is chemically more active than the material of the conductive layer and forms a stable oxide. Such a relationship may be characterized in one embodiment by the free energy of formation of the passivation structure being less than approximately −100 kcal/mol, i.e., $\Delta F.° \leq -100$ kcal/mol, though other values are also possible.

According to any of the embodiments described herein, the polycrystalline conductive material used as an electrode, metallization, wiring, interconnect, pad, or other conductive structure may be any suitable conductive material. According to some embodiments, the conductive material may be any of: Aluminum, Copper, Molybdenum, Tungsten, Tantalum, Ruthenium, Rhodium, Iridium, and Silicon. These, however, are non-limiting examples and other materials may suitably be used.

The thickness of the passivation structures described herein may take any value suitable to inhibit or prevent foreign molecules from contacting the passivated electrode while at the same time not negatively impacting the resonance behavior of the micromechanical resonating structure to a significant degree. The potential impact on the resonance behavior of the passivation structure may impose an upper limit on the thickness, while the ability of the passivation structure to inhibit foreign molecules contacting the conductive layer (e.g., electrode) may impose a lower limit on the thickness. Given these considerations, the thickness selected may depend on factors including the material of the passivation structure, the types and amount of foreign molecules to which the passivation structure is anticipated to be exposed, and the conditions under which the exposure is likely to occur (e.g., the temperature, pressure, time duration, etc.).

According to one aspect of the invention, the thickness of the passivation structure may be selected in dependence on the resonance wavelength, $\lambda$, supported by the resonator. According to some embodiments, the passivation structure is very thin in terms of the resonator dimensions and the wavelength $\lambda$ of the resonant mode (e.g., a resonant Lamb wave supported by the micromechanical resonating structure). According to one embodiment, the ratio of thickness h of the passivation structure (e.g., the height h illustrated in FIG. 6 for passivation structure 123 or the height of the passivation structure 122 in FIG. 5) to the wavelength $\lambda$ is $0.00001 \leq h/\lambda \leq 0.1$ (e.g., 0.001, 0.01, or any other suitable value in this range). In some such embodiments, the ratio is $0.0003 \leq h/\lambda \leq 0.05$. Other values for the thickness of the passivation structure are also possible, however, as these are non-limiting examples.

The wavelength $\lambda$ of the resonant mode may take any suitable value and may be determined from the desired operating frequency of the resonator. In that respect, it should be appreciated that the mechanical resonating structures according to any of the embodiments described herein may have any desired resonance frequencies and frequencies of operation, and may be configured to provide output signals of any desired frequencies. For example, the resonance frequencies and/or frequencies of operation of the mechanical resonating structures, and the frequencies of the output signals provided by the mechanical resonating structures, may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the frequencies are not limiting. The wavelength $\lambda$ may therefore take any value corresponding to these frequencies, or any other suitable values.

According to another aspect of the invention, the thickness of the passivation structure may be selected in dependence on the total thickness of the micromechanical resonating structure, which may also be considered the same as the total thickness of the MEMS resonator ignoring any substrate of the resonator. The total thickness of the resonating structure may impact its resonance behavior, such as its resonance frequency. As shown in FIG. 1 and in FIG. 6, resonating structures of micromechanical resonators may include various components, including an active layer (e.g., active layer 606 in FIG. 6), one or more electrodes (e.g., bottom electrode 608 and top electrode 110 in FIG. 6), and a passivation structure. Other components may also be included, an example being shown in FIG. 6. As shown therein, a micromechanical resonator (e.g., a MEMS resonator) may include a layered temperature compensation structure configured to account for temperature variations in the resonance behavior of the active layer to provide a stable resonator output frequency over temperature. Suitable temperature compensation structures are described in U.S. Patent Application Publication 2010-0182102 filed Dec. 16, 2009 and entitled "Mechanical Resonating Structures Including A Temperature Compensation Structure" which is hereby incorporated herein by reference in its entirety. According to one non-limiting embodiment, the layered temperature compensation structure may include two layers configured below the illustrated bottom electrode. The first layer may be of a first material (e.g., silicon) and the second layer may be of a second material that shows counteracting temperature behavior to that of the first material, such as silicon oxide. According to an alternative embodiment, the layered temperature compensation structure may include three layers (e.g., a first layer 614, a second layer 612, and a third layer 610), with a second layer 612 configured between first and third layers, as illustrated. The first and third layers may include the same material (e.g., silicon oxide) as each other and the second layer may include a different material, e.g., silicon. The total thickness of a micromechanical resonator may therefore include the thickness of such temperature compensation structures. In the non-limiting example of FIG. 6, the total thickness of the resonator is labeled as $h_{res}$ and includes the thicknesses of the temperature compensation layers, the active layer, the bottom electrode and the top electrode.

According to one embodiment, the ratio of thickness h of the passivation structure to the total resonator thickness $h_{res}$ is $0.00001 \leq h/h_{res} \leq 0.1$ (e.g., between 0.0001 and 0.001 or between 0.001 and 0.01, among other possibilities). According to some such embodiments, the ratio is $0.0003 \leq h/h_{res} \leq 0.05$. For these non-limiting ranges, it is assumed that the total resonator thickness excludes the thickness of the passivation structure. Other values for the thickness of the passivation structure are also possible, however, as these are non-limiting examples. Non-limiting examples of values for the thickness of the passivation structure include 10-500 nm, 20-200 nm, and 10-100 nm, such as 20 nm, 50 nm, and 100 nm, among other possibilities.

According to some embodiments, the micromechanical resonating structure may have a substantially uniform thickness $h_{res}$, which in some embodiments is less than approximately three wavelengths of a resonance frequency of interest of the resonating structure. According to some embodiments, the thickness $h_{res}$ is less than approximately two wavelengths of the resonance frequency of interest. In still other embodiments, the thickness $h_{res}$ may be less than approximately one wavelength of the resonance frequency of interest (e.g., less than approximately one wavelength of a resonant Lamb wave supported by the mechanical resonating structure). The thickness may determine or depend on the types of waves supported by the mechanical resonating structure. For example, a given thickness may limit the ability of the mechanical resonating structure to support Lamb waves, or certain modes of Lamb waves. Thus, it should be appreciated that the thickness may be chosen in dependence on the types and/or modes of waves desired to be supported by the mechanical resonating structure. Thus, it should also be appreciated that thickness values other than those listed may be suitable for some applications, and that the various aspects described herein are not limited to using mechanical resonating structures having any particular thickness values.

As previously mentioned, some embodiments of the micromechanical resonators described herein are MEMS resonators, though not all are limited in this respect. According to some embodiments the mechanical resonating structures of the resonators described herein are micromechanical resonating structures, e.g., of a MEMS resonator. The mechanical resonating structures may have a "large dimension" (i.e., the largest of the length, width, thickness, etc.) of less than 1 mm in some embodiments, less than 500 microns in some embodiments, less than 100 microns, less than 50 microns, or less than 10 microns, or any other suitable value. In some embodiments, the mechanical resonating structures may have a thin film active layer (e.g., a thin film active piezoelectric layer), as should be appreciated from the description elsewhere herein about suitable thicknesses of the resonator. According to some embodiments, the micromechanical resonating structures are acoustically isolated from a supporting structure such as a substrate. The acoustic isolation may be accomplished in various manners, for example by suspending the micromechanical resonating structure above a cavity (e.g., as shown in FIG. 1), by mounting the micromechanical resonating structure on an acoustic mirror stack, or in any other suitable manner. According to one aspect of the invention, a MEMS resonator is provided including a micromechanical resonating structure having one or more of the dimensions or acoustic configurations described herein.

Figure 7:
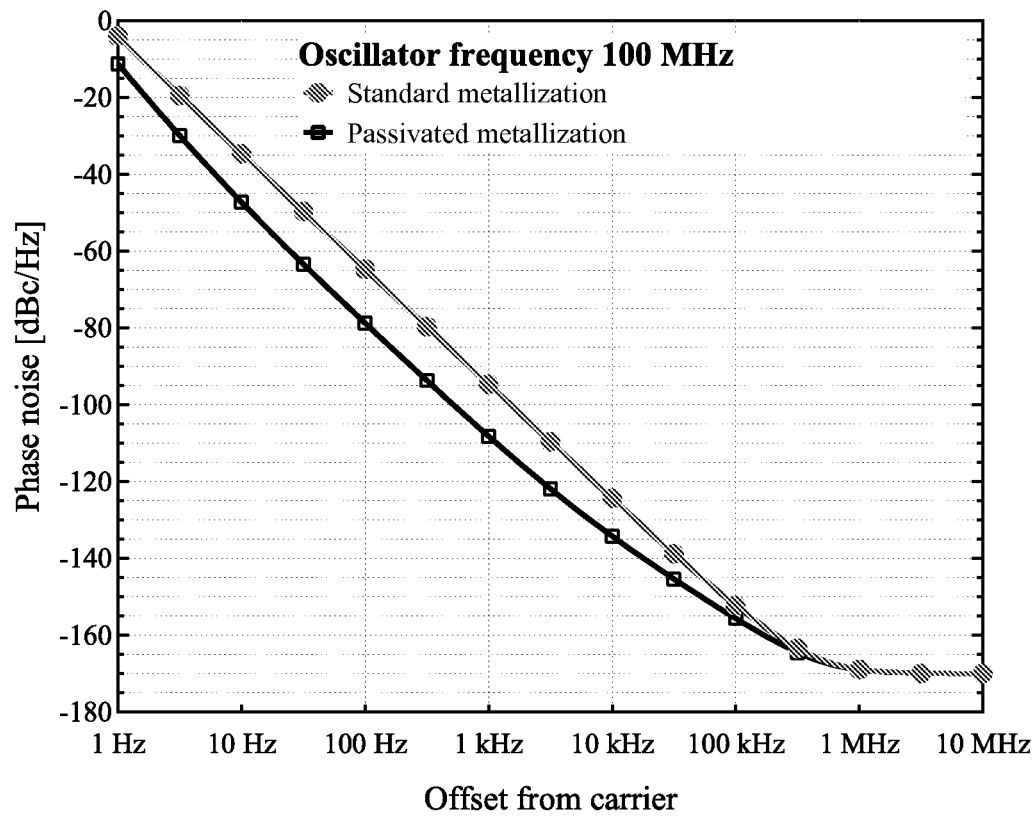
FIG. 7 is a graph illustrating a non-limiting example of the improvement in phase noise compared to non-passivated resonators that may be achieved by using resonators of the types described herein.

As mentioned, passivation structures according to the various aspects and embodiments described herein may inhibit or prevent the physical and chemical modification of the protected polycrystalline conductive layers (e.g., electrode) at the grain boundaries of such layers and therefore may prevent additional defects and material instabilities of the layers. As a result, the flicker noise of a resonator employing such a passivation structure may be smaller, and in some instances much smaller, than conventional MEMS resonators. Therefore, for any oscillator incorporating the resonator, the $1/f^3$ noise component of the oscillator output may be largely reduced. An example is shown in the graph of FIG. 7, comparing the phase noise for a MEMS resonator using a standard metallization to that of a MEMS resonator using a passivation structure according to one or more aspects of the present invention and assumes a carrier frequency of 100 MHz. As shown, the passivated MEMS resonator may exhibit an improvement in phase noise of between approximately 10-20 dBc/Hz, as a non-limiting example. The improvement may be most pronounced for the offset frequency range from 1 Hz to 100 kHz, though this is merely a non-limiting example.

According to one aspect of the invention, a method of fabricating a passivated MEMS resonator is provided. The method may comprise forming a micromechanical resonating structure including an active layer, forming one or more polycrystalline electrodes on the active layer, and then forming (e.g., by deposition, growth, or any other suitable process) a passivation structure on the electrode(s). The passivation structure may have a different polycrystalline configuration than that of the polycrystalline electrode(s). A non-limiting example is described with respect to FIG. 6.

Referring to the resonator of FIG. 6, an active layer 606 (e.g., of piezoelectric material) may be formed on a bottom electrode 608. A top electrode 110 may then be formed and patterned, followed by formation of a passivation structure 123. According to the illustrated embodiment, the resonator may also include a temperature compensation structure in the form of layers 610, 612, and 614. These may be formed in any suitable manner, for example prior to formation of the bottom electrode 608. The rest of the fabrication may then proceed as described. However, it should be appreciated that the various embodiments described herein are not limited to any particular manner of fabrication unless otherwise stated.

The mechanical resonating structures described herein may be used as stand alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the resonators (e.g., MEMS resonators) described herein may be used in combination with a feedback circuit to form a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals.

As illustrated with respect to FIG. 1, some embodiments include suspended mechanical resonating structures (e.g., mechanical resonating structure 104). The structures may be suspended in that they may have one or more segments which are not directly attached to any other structures. It should be appreciated that various forms of "suspended" structures may be used, including, but not limited to, structures having any one or more free surfaces.

In some embodiments, suspended mechanical resonating structures may be coupled to a relatively stationary support structure, such as a substrate, by any suitable type, number, and configuration of anchors (e.g., anchors 106). In some embodiments, the number of anchors may equal the number of electrical ports of the mechanical resonating structure. However, not all embodiments are limited in this respect. For example, the number of anchors, which may be two or more according to various embodiments, may be selected based on a desired degree of support to be provided by the anchors (e.g., a greater number of anchors may make the device more resilient or rugged), a desired quality factor Q of the mechanical resonating structure (e.g., a greater number of anchors may lower Q), and/or a desire to suppress any particular modes of vibration of interest (e.g., the number of anchors may be selected, and the anchors configured, to suppress certain undesirable modes of vibration). According to some embodiments of the present invention, suspended mechanical resonating structures may be coupled to a substrate (or other supporting structure) by two anchors, by four anchors, by six anchors, by eight anchors, by ten anchors, or by any other suitable number of anchors given the considerations outlined above.

It should be appreciated that mechanical resonating structures described herein may have any suitable type, number, and configuration of electrodes. In some embodiments, the electrodes are individual strips. However, the electrodes may take any suitable shape. The electrodes may extend along substantially the entire width of the mechanical resonating structure, or may alternatively extend along only a part of the width (e.g., half the width, a quarter of the width, etc.). Other configurations are also possible, as the various structures herein including electrodes are not limited to any particular number, shapes, or configurations of electrodes, unless so stated. Thus, it should be appreciated that the examples of electrode configurations described herein are not limiting.

According to some embodiments, the mechanical resonating structures described herein may be piezoelectric Lamb wave devices, such as piezoelectric Lamb wave resonators. Such Lamb wave devices may operate based on propagating acoustic waves, with the edges of the micromechanical resonating structure serving as reflectors for the waves. For such devices, the spacing between the resonating structure edges (e.g., the ends of the resonating structure) may define the resonance cavity, and resonance may be achieved when the cavity is an integer multiple of p, where $p=\lambda/2$, with $\lambda$ being the acoustic wavelength of the Lamb wave of interest, understanding that the device may support more than one mode of Lamb waves. However, it should be appreciated that aspects of the technology described herein apply to other types of structures as well, and that Lamb wave structures are merely non-limiting examples.

Lamb waves are one non-limiting example of a mode of operation which may be exhibited by micromechanical resonators according to the aspects described herein. According to other embodiments, the mechanical resonating structures may be configured to operate in a contour mode, bulk mode, plate mode, flexural mode, any resonant mode of the following resonating structure shapes: any antenna type geometry; beams; cantilevers; free-free bridges; free-clamped bridges; clamped-clamped bridges; discs; rings; prisms; cylinders; tubes; spheres; shells; springs; polygons; diaphragms; and tori; or any other suitable mode.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

In addition, while some references have been incorporated herein by reference, it should be appreciated that the present application controls to the extent the incorporated references are contrary to what is described herein.

What is claimed is:

1. A micromechanical resonator, comprising:
a micromechanical resonating structure comprising a piezoelectric active layer;
a first electrode disposed on a first side of the piezoelectric active layer;
a patterned second electrode disposed on a second side of the piezoelectric active layer so that the piezoelectric active layer is between the first electrode and the second electrode, the patterned second electrode being polycrystalline; and
a passivation structure formed on the patterned second electrode and configured to inhibit external contaminants from entering grain boundaries of the patterned second electrode,
wherein the piezoelectric active layer comprises a piezoelectric material and wherein the passivation structure comprises the piezoelectric material.

2. The micromechanical resonator of claim 1, wherein the micromechanical resonating structure is configured to support Lamb waves in response to excitation.

3. A micromechanical resonator, comprising:
a micromechanical resonating structure comprising a piezoelectric active layer;
a first electrode disposed on a first side of the piezoelectric active layer;
a patterned second electrode disposed on a second side of the piezoelectric active layer so that the piezoelectric active layer is between the first electrode and the second electrode, the patterned second electrode being polycrystalline; and
a passivation structure formed on the patterned second electrode and configured to inhibit external contaminants from entering grain boundaries of the patterned second electrode, wherein the piezoelectric active layer is configured to exhibit resonance vibration having a wavelength λ, and wherein the passivation structure has a thickness h given by $0.00001 \leq h/\lambda \leq 0.1$.

4. The micromechanical resonator of claim 3, wherein the first electrode is patterned.

5. The micromechanical resonator of claim 3, wherein the passivation structure is patterned in a same shape as the patterned second electrode.

6. The micromechanical resonator of claim 3, wherein the passivation structure is unpatterned.

7. The micromechanical resonator of claim 3, wherein the thickness of the passivation structure is given by $0.0003 \leq h/\lambda \leq 0.05$.

8. The micromechanical resonator of claim 3, wherein the micromechanical resonating structure is acoustically isolated from a substrate of the micromechanical resonator.

9. The micromechanical resonator of claim 3, wherein the micromechanical resonating structure has a large dimension less than approximately 500 microns.

10. A micromechanical resonator, comprising:
a micromechanical resonating structure comprising a piezoelectric active layer;
a first electrode disposed on a first side of the piezoelectric active layer;
a patterned second electrode disposed on a second side of the piezoelectric active layer so that the piezoelectric active layer is between the first electrode and the second electrode, the patterned second electrode being polycrystalline; and
a passivation structure formed on the patterned second electrode and configured to inhibit external contaminants from entering grain boundaries of the patterned second electrode,
wherein the resonator has a total thickness $h_{res}$ and wherein the passivation structure has a thickness h given by $0.00001 \leq h/h_{res} \leq 0.1$.

11. The micromechanical resonator of claim 10, wherein the passivation structure has a thickness given by $0.0003 \leq h/h_{res} \leq 0.05$.

12. A micromechanical resonator, comprising:
a micromechanical resonating structure comprising a piezoelectric active layer;
a first electrode disposed on a first side of the piezoelectric active layer;
a patterned second electrode disposed on a second side of the piezoelectric active layer so that the piezoelectric active layer is between the first electrode and the second electrode, the patterned second electrode being polycrystalline; and
a passivation structure formed on the patterned second electrode and configured to inhibit external contaminants from entering grain boundaries of the patterned second electrode,
wherein the patterned second electrode is formed of a first material, wherein the passivation structure is formed of the first material and has a polycrystalline structure, and wherein grain boundaries of the patterned second electrode do not substantially align with grain boundaries of the passivation structure.

13. The micromechanical resonator of claim 12, wherein the passivation structure is monocrystalline.

14. The micromechanical resonator of claim 12, wherein the passivation structure is polycrystalline and has a crystal configuration that does not substantially align with grain boundaries of the second electrode.

15. A method of fabricating a passivated microelectromechanical resonator, the method comprising:
forming an active layer of a micromechanical resonating structure;
forming a polycrystalline electrode on the active layer; and
forming a passivation structure on the polycrystalline electrode having a different crystal configuration than a crystal configuration of the polycrystalline electrode,
wherein forming the passivation structure comprises forming the passivation structure of a same piezoelectric material as is used in forming the active layer.

16. A passivated micromechanical resonator, comprising:
a substrate;
a first electrical pad on the substrate;
a second electrical pad on the substrate;
a micromechanical resonating structure electrically coupled to the first electrical pad and the second electrical pad and comprising:
a layered temperature compensation structure comprising a first layer and a second layer, the layered temperature compensation structure configured to stabilize operation of the micromechanical resonating structure as temperature varies;
a bottom electrode disposed on the layered temperature compensation structure;
an active layer comprising a piezoelectric material disposed on the bottom electrode;
a polycrystalline top electrode disposed on the active layer; and
a passivation layer disposed on the polycrystalline top electrode and configured to inhibit contact of external materials with the polycrystalline top electrode; and
a first anchor and a second anchor mechanically coupling the micromechanical resonating structure to the substrate.

17. The passivated micromechanical resonator of claim 16, wherein the layered temperature compensation structure further comprises a third layer formed of a same material as the first layer, and wherein the second layer of the layered temperature compensation structure is arranged between the first layer and the third layer.

18. The passivated micromechanical resonator of claim 16, wherein the active layer is configured to support Lamb waves in response to excitation.

19. A method of fabricating a passivated microelectromechanical resonator, the method comprising:
forming an active layer of a micromechanical resonating structure;
forming a polycrystalline electrode on the active layer; and
forming a passivation structure on the polycrystalline electrode having a different crystal configuration than a crystal configuration of the polycrystalline electrode,
wherein the active layer is configured to support a resonance vibration mode having a wavelength λ, and wherein forming the passivation structure comprises forming the passivation structure to have a thickness h satisfying the condition $0.00001 \leq h/\lambda \leq 0.1$.

20. A method of fabricating a passivated microelectromechanical resonator, the method comprising:
forming an active layer of a micromechanical resonating structure;
forming a polycrystalline electrode on the active layer; and
forming a passivation structure on the polycrystalline electrode having a different crystal configuration than a crystal configuration of the polycrystalline electrode,
wherein the polycrystalline electrode is a first electrode and is patterned, and wherein the method further comprises forming a second electrode, wherein the active layer is configured between the first electrode and the second electrode.

\* \* \* \* \*